United States Patent
Liang et al.

(12) 
(10) Patent No.: US 10,886,324 B2
(45) Date of Patent: Jan. 5, 2021

(54) DETECTION PANEL AND DETECTION DEVICE

(71) Applicant: BOE TECHNOLOGY GROUP CO., LTD., Beijing (CN)

(72) Inventors: Kui Liang, Beijing (CN); Chiachiang Lin, Beijing (CN); Xiaohui Liu, Beijing (CN); Liye Duan, Beijing (CN); Chunqian Zhang, Beijing (CN); Mengjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/388,568

(22) Filed: Apr. 18, 2019

(65) Prior Publication Data

US 2020/0020736 A1 Jan. 16, 2020

(30) Foreign Application Priority Data

Jul. 13, 2018 (CN) .......................... 2018 1 0772620

(51) Int. Cl.
*H01L 27/146* (2006.01)
*H01L 31/08* (2006.01)

(52) U.S. Cl.
CPC .. *H01L 27/14676* (2013.01); *H01L 27/14603* (2013.01); *H01L 27/14614* (2013.01); *H01L 27/14636* (2013.01); *H01L 31/085* (2013.01)

(58) Field of Classification Search
CPC ......... H01L 27/14676; H01L 27/14614; H01L 27/14636; H01L 31/085; H01L 27/14603; H01L 27/14663; H01L 31/0216; H01L 31/0224; H01L 31/115
See application file for complete search history.

(56) References Cited

U.S. PATENT DOCUMENTS

| | | | |
|---|---|---|---|
| 10,365,384 B2 | 7/2019 | Jiang | |
| 2006/0165341 A1* | 7/2006 | Yan | G02B 6/12019 385/8 |
| 2012/0038013 A1 | 2/2012 | Karim et al. | |
| 2017/0285185 A1* | 10/2017 | Jiang | A61B 6/4233 |
| 2018/0061884 A1* | 3/2018 | Jun | H01L 27/14627 |
| 2019/0198688 A1* | 6/2019 | Ma | H01L 31/202 |

FOREIGN PATENT DOCUMENTS

| | | | | |
|---|---|---|---|---|
| CN | 105093259 A | | 8/2015 | |
| CN | 105093259 A | * | 11/2015 | .......... G01T 1/2002 |
| CN | 107170842 A | * | 9/2017 | ..... H01L 31/035272 |
| CN | 107170842 A | | 9/2017 | |
| CN | 107609518 A | | 1/2018 | |

OTHER PUBLICATIONS

Office Action issued in corresponding Chinese Patent Application No. 201810772620.5, dated Mar. 4, 2020.

* cited by examiner

*Primary Examiner* — Chih-Cheng Kao

(74) *Attorney, Agent, or Firm* — McDermott Will & Emery LLP

(57) ABSTRACT

A detection panel and a detection device are provided. The detection panel includes: a base substrate, a photoelectric conversion layer and a first insulating layer which are sequentially stacked on the base substrate; wherein the detection panel further comprises a plurality of interdigital electrodes located on a surface of a side of the first insulating layer away from the base substrate.

11 Claims, 5 Drawing Sheets

DETECTION PANEL AND DETECTION DEVICE

CROSS-REFERENCE TO RELATED APPLICATION

The present application claims the benefit of Chinese Patent Application No. 201810772620.5 filed on Jul. 13, 2018 in the State Intellectual Property Office of China, the whole disclosure of which is incorporated herein by reference.

TECHNICAL FIELD

The present disclosure relates to the field of detection technologies, and in particular, to a detection panel and a detection device.

BACKGROUND

Detection technology, such as X-ray detection technology, is widely used in medical, security, non-destructive test, scientific research and other fields. X-ray detection technology has been able to convert X-ray signals to be detected into images or photos that may be directly displayed on the screen.

At present, a detection device using an X-ray detecting technique usually uses a PIN diode as a photosensitive member to realize photoelectric conversion. However, such a PIN diode needs to be processed by ion doping during the fabrication process, such as P-type ion doping, which complicates the fabrication process.

SUMMARY

According to an aspect of the present disclosure, there is provided a detection panel comprising a base substrate, a photoelectric conversion layer and a first insulating layer which are sequentially stacked on the base substrate;

wherein the detection panel further comprises a plurality of interdigital electrodes located on a surface of a side of the first insulating layer away from the base substrate.

In some embodiments of the present disclosure, the detection panel further comprises a second insulating layer covering the interdigital electrodes, and a plurality of switching transistors on a surface of the second insulating layer at a side thereof away from the base substrate; one of a source and a drain of each switching transistor is electrically connected to one of the interdigital electrodes.

In some embodiments of the present disclosure, the detection panel comprises a plurality of read signal lines and a plurality of strobe signal lines, and the read signal lines and the strobe signal lines cross each other to define a plurality of detection units;

an interdigital electrode and a switching transistors are disposed in each one of the detection units;

a gate of the switching transistor is electrically connected to the strobe signal line, and the other of the source and the drain of the switching transistor is electrically connected to the read signal line.

In some embodiments of the present disclosure, the interdigital electrode comprises a sensing sub-electrode in a comb shape and a biasing sub-electrode in a comb shape, the sensing sub-electrode and the biasing sub-electrode being interdigitated, the one of the source and the drain of the switching transistor is electrically connected to one of the sensing sub-electrodes.

In some embodiments of the present disclosure, a first via hole is provided in the second insulating layer, and the one of the source and the drain of the switching transistor is electrically connected to the sensing sub-electrode through the first via hole.

In some embodiments of the present disclosure, the switching transistor is a bottom gate type thin film transistor; and a second via hole is provided in the gate insulating layer of the bottom gate type thin film transistor, the one of the source and the drain of the switching transistor is electrically connected to the sensing sub-electrode through the second via hole and the first via hole in sequence.

In some embodiments of the present disclosure, the switching transistor is a top gate type thin film transistor; and the top gate type thin film transistor is provided with a second via hole penetrating a gate insulating layer and a passivation layer, the one of the source and the drain of the switching transistor is electrically connected to the sensing sub-electrode through the second via hole and the first via hole in sequence.

In some embodiments of the present disclosure, the second via hole is aligned with the first via hole.

In some embodiments of the present disclosure, the base substrate is an optical waveguide glass substrate.

In some embodiments of the present disclosure, a material constituting the first insulating layer comprises polyimide.

In some embodiments of the present disclosure, a material constituting the second insulating layer is a photoresist material.

In some embodiments of the present disclosure, the detection panel further comprises a wavelength conversion layer configured to convert non-visible light into visible light; and wherein the wavelength conversion layer is located on a surface of the base substrate at a side thereof away from the first insulating layer.

In some embodiments of the present disclosure, an edge of the interdigital electrode has a side surface that is inclined with respect to the surface of the first insulating layer.

According to another aspect of the present disclosure, there is provided a detection device comprising the detection panel mentioned above.

BRIEF DESCRIPTION OF THE DRAWINGS

In order to more clearly illustrate the technical solutions of the embodiments of the present disclosure or those in the prior art, the drawings to be used in the embodiments or the description of the prior art will be briefly described below. Obviously, the drawings in the following description are only some embodiments of the present disclosure, and other drawings may be obtained from those skilled in the art without any inventive effort.

DETAILED DESCRIPTION OF EMBODIMENTS

The technical solutions in the embodiments of the present disclosure are clearly and completely described in the following with reference to the accompanying drawings in the embodiments of the present disclosure. It is obvious that the described embodiments are only some of the embodiments of the present disclosure, instead of all the embodiments. All other embodiments obtained by those skilled in the art based on the embodiments of the present disclosure without an inventive effort are within the protective scope of the disclosure.

In the following, the terms "first" and "second" are used for descriptive purposes only, and are not to be construed as indicating or suggesting a relative importance or implicitly indicating the number of technical features indicated. Thus, features defined by "first" and "second" may include one or more of the features either explicitly or implicitly. In the description of the embodiments of the present disclosure, the expression "plurality of" means two or more, unless otherwise stated.

Figure 1:
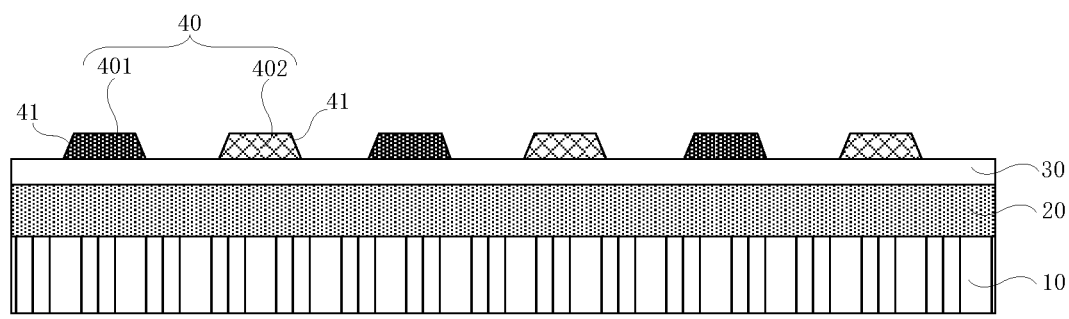
FIG. 1 is a schematic structural view of a detection panel according to some embodiments of the present disclosure.

In an aspect of the embodiments of the present disclosure, a detection panel 01 is provided. As shown in FIG. 1, the detection panel 01 may include a transparent base substrate 10, and a photoelectric conversion layer 20 and a first insulating layer 30 sequentially disposed on the base substrate 10.

The photoelectric conversion layer 20 may convert an optical signal into an electrical signal, and the material constituting the photoelectric conversion layer 20 is a semiconductor amorphous silicon material, for example, amorphous silicon (a_Si).

The material constituting the first insulating layer 30 may include at least one of polyimide (PI), polyurethane, poly (p-phenylene terephthalamide), or polyamideimide.

In addition, the above detection panel 01 further includes a plurality of interdigital electrodes 40. The interdigital electrode 40 is located on a surface of a side of the first insulating layer 30 away from the base substrate 10.

Figure 2:
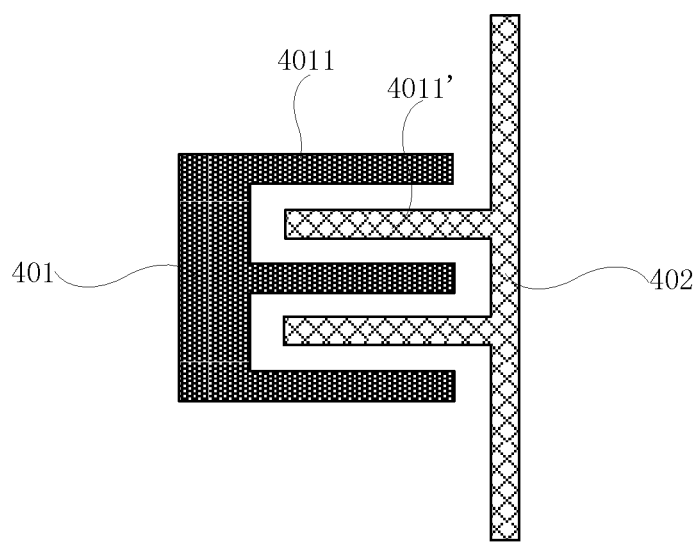
FIG. 2 is a schematic structural view of the interdigital electrode of FIG. 1.

In some embodiments of the present disclosure, as shown in FIG. 2, the interdigital electrode 40 includes a sensing sub-electrode 401 in a comb shape and a biasing sub-electrode 402 in a comb shape. The sensing sub-electrode 401 and the biasing sub-electrode 402 are interdigited.

It should be noted that above expression "the sensing sub-electrode 401 and the biasing sub-electrode 402 are interdigited" means that electrode branches 4011 of the sensing sub-electrode 401 in a comb shape are set to be alternated with electrode branches 4011' of the biasing sub-electrode 402 in a comb shape.

Figure 3:
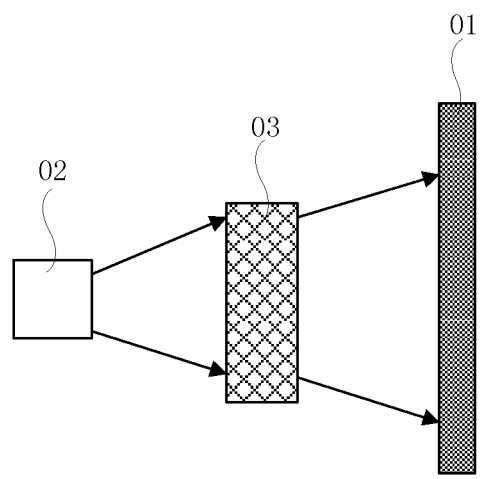
FIG. 3 is a schematic view in which the detection panel shown in FIG. 1 conducts a detection.

Based on this, when an object to be detected is detected by the above-mentioned detection panel 01, as shown in FIG. 3, a detecting light emitted by a light source 02 (indicated by the arrow in FIG. 3) passes through the object 03 to be detected and is incident on the detection panel 01. Once the detection light enters the detection panel 01, it passes through the base substrate 10 as shown in FIG. 1 and is irradiated onto a photoelectric conversion layer 20.

In such a case, incident lights are received by the above-described photoelectric conversion layer 20 and charges are thus incurred/stimulated in photoelectric conversion layer 20. At this time, a resistance of the photoelectric conversion layer 20 is significantly decreased, so that the received optical signal may be converted into an electrical signal due to a photovoltaic effect occurring therein. At the same time, a forward voltage is applied to the biasing sub-electrode 402 in the interdigital electrode 40, and the biasing sub-electrode 402 may provide a relatively larger external bias to the first insulating layer 30. In a condition that the voltage applying on the biasing sub-electrode 402 is sufficiently high, the first insulating layer 30 may be changed to be conductive by the F-N (Fowler-Nordheim) tunneling effect of the electrons occurring therein, so that the electrical signal generated by the photoelectric conversion layer 20 may be transmitted to the sensing sub-electrode 401 in the interdigital electrode 40.

In some embodiments of the present disclosure, the first insulating layer 30 may have a thickness of 1000 to 2000 angstroms.

It may be seen that the first insulating layer 30 is disposed between the interdigital electrode 40 and the photoelectric conversion layer 20, so that the interdigital electrode 40 may be prevented from directly contacting the photoelectric conversion layer 20, then the photoelectric conversion layer 20 may be prevented from outputting dark current noise to the sensing sub-electrode 401 without receiving the optical signal.

In a condition that the detection light emitted by the light source 02 in FIG. 3 is a visible light, the photoelectric conversion layer 20 may convert the optical signal of the visible light into an electrical signal directly.

Figure 4:
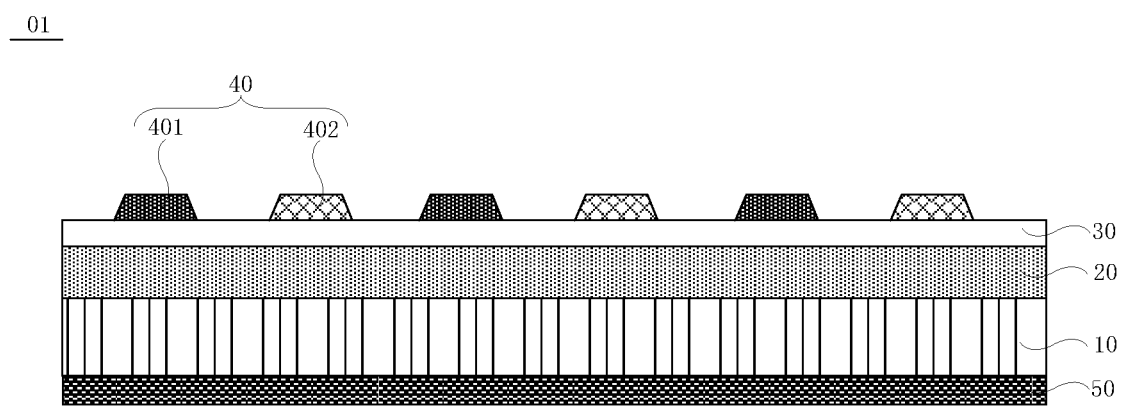
FIG. 4 is a cross-sectional structural view of a detection panel according to some embodiments of the present disclosure, in which a wavelength conversion layer is shown.

Alternatively, in a condition that the detection light emitted by the light source 02 in FIG. 3 is an X-ray, in order to enable the photoelectric conversion layer 20 in the detection panel 01 to still achieve photoelectric conversion, as shown in FIG. 4, the detection panel 01 further includes a wavelength conversion layer 50 for converting X-rays into visible lights.

The wavelength conversion layer 50 is located on a surface of a side of the base substrate 01 away from the first insulating layer 30. When a detection is performed, the X-ray emitted from the light source 02 is firstly incident on the wavelength conversion layer 50. In some embodiments of the present disclosure, the wavelength conversion layer 50 is capable of converting non-visible light (e.g., X-rays) into visible light with a wavelength of about 550 nm. The visible light passing through the wavelength conversion layer 50 continues to be incident on the photoelectric conversion layer 20 for photoelectric conversion.

In some embodiments of the present disclosure, the material constituting the wavelength conversion layer 50 may include at least one of a phosphor, cesium iodide (CsI), bismuth oxysulfide phosphor ($Gd_2O_2S$:Tb, GOS), tin sulfide (ZnS), or cadmium tungstate ($CdWO_4$).

It should be noted that the above description is based on the case where the non-visible light emitted from the light source 02 is X-ray. In a condition that the light source 02 may also emit other non-visible light, for example, γ-ray, it is only necessary to adjust the material constituting the wavelength conversion layer 50, such that other non-visible light incident on the wavelength conversion layer 50, for example, γ-ray, may be converted into visible light.

The photoelectric conversion layer 20 is used as the photosensitive member for realizing photoelectric conversion in the detection panel 01 provided by the embodiment of the present disclosure. Therefore, it is not necessary to provide a PIN diode for photoelectric conversion in the detection panel 01, so that in the process of manufacturing the detection panel 01, it is not necessary to perform a process of ion doping in the process of fabricating the photosensitive member, thereby simplifying the manufacturing process and reducing the manufacturing cost.

Further, as shown in FIG. 1, the photoelectric conversion layer 20 is in a direct contact with the upper surface of the base substrate 10, and thus the photoelectric conversion layer 20 has a good flatness. In addition, the first insulating layer 30 is in contact with the upper surface of the photoelectric conversion layer 20. Therefore, the first insulating layer 30 also has a good flatness. In this case, the upper surface of the first insulating layer 30 may provide a metal deposition surface with a higher flatness for the sensing sub-electrode 401 and the biasing sub-electrode 402 in the interdigital electrode 40, thereby reducing a chance that the sensing sub-electrode 401 and the biasing sub-electrode 402 may fall off.

It should be noted that, in the present disclosure, the orientation terms such as "upper" and "lower" are defined relative to the orientation in which the detection panel 01 is schematically placed in the drawing, it should be understood that these directional terms may be changed according to a change of the orientation of the position of the detection panel 01.

Figure 5:
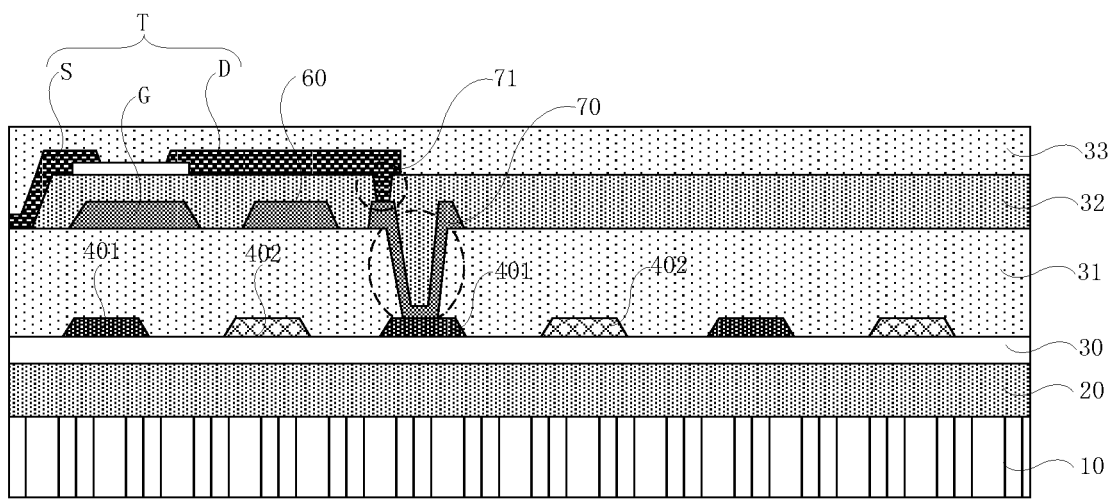
FIG. 5 is a cross-sectional structural view of a detection panel according to some embodiments of the present disclosure, in which a second insulating layer, a third insulating layer, and a gate insulating layer are shown.

As may be seen from the above, after a forward voltage is applied to the biasing sub-electrode 402 and the photoelectric conversion layer 20 receives an optical signal, the electrical signal generated by the photoelectric conversion layer 20 may be transmitted to the sensing sub-electrode 401. In order to output the electrical signal in the sensing sub-electrode 401 to the detecting circuit as needed, as shown in FIG. 5, the detection panel 01 further includes a second insulating layer 31 covering the interdigital electrode 40 (including the sensing sub-electrode 401 and the biasing sub-electrode 402), and a plurality of switching transistors T located on a surface of a side of the second insulating layer 31 away from the base substrate 10 (one TFT is illustrated in FIG. 5). A first electrode (e.g., the drain D) of each switching transistor T is electrically connected to an interdigital electrode 40.

In some embodiments of the present disclosure, the material constituting the second insulating layer 31 is a photoresist material, for example, a photoresist.

In the case where the interdigital electrode 40 includes the above-described sensing sub-electrode 401 and the biasing sub-electrode 402, above expression "the first electrode (for example, the drain D) of the switching transistor T is electrically connected to an interdigital electrode 40" means that the first electrode (e.g., the drain D) of the switching transistor T is electrically connected to the sensing sub-electrode 401 in one of the interdigital electrodes 40.

In order to electrically connect the first electrode (e.g., drain D) of the switching transistor T to the sensing sub-electrode 401, in some embodiments of the present disclosure, as shown in FIG. 5, the second insulating layer 31 may be provided with a first via hole 70, and the first electrode (for example, the drain D) of the switching transistor T is electrically connected to the sensing sub-electrode 401 through the first via hole 70.

Further, in the case where the switching transistor T is a thin film transistor (TFT) of a bottom gate type, a gate insulating layer 32 is provided between the gate G of the switching transistor T and the first electrode.

In this case, the gate insulating layer 32 is provided with a second via hole 71, and the first electrode (for example, the drain D) of the switching transistor T is electrically connected to the sensing sub-electrodes 401 through the second via hole 71 and the first via hole 70 sequentially.

As shown in FIG. 5, a conductive material in the first via hole 70 for electrically connecting the first electrode (e.g., drain D) of the switching transistor T to the sensing sub-electrode 401 may be the same material and in the same layer with the gate G of the switching transistor T. In addition, a conductive material in the second via hole 71 for electrically connecting the first electrode (e.g., drain D) of the switching transistor T and the sensing sub-electrode 401 may be the same material and in the same layer with the source S and the drain D of the switching transistor T.

In addition, in order to prevent the source S and the drain D of the switching transistor T from being exposed, as shown in FIG. 5, the detection panel 01 further includes a third insulating layer 33 covering the source S and the drain D of the switching transistor T. The third insulating layer 33 may be a passivation layer (PVX).

It should be noted that the sensing sub-electrode 401 and the biasing sub-electrode 402 may have a thickness of 500 to 600 angstroms, and the gate G of the switching transistor T may have a thickness of about 4000 angstroms. Therefore, there is a good adhesion between each one of the sensing sub-electrode 401, the biasing sub-electrode 402 with the insulating layer, for example, the first insulating layer 30 described above. Based on this, in order to improve the adhesion between the gate G of the switching transistor T and the insulating layer (for example, the second insulating layer 31), a buffer layer made of silicon nitride may be disposed between the gate G of the switching transistor T and the second insulating layer 31, thereby reducing a chance that the gate G of the switching transistor T may be detached from the second insulating layer 31.

Figure 6:
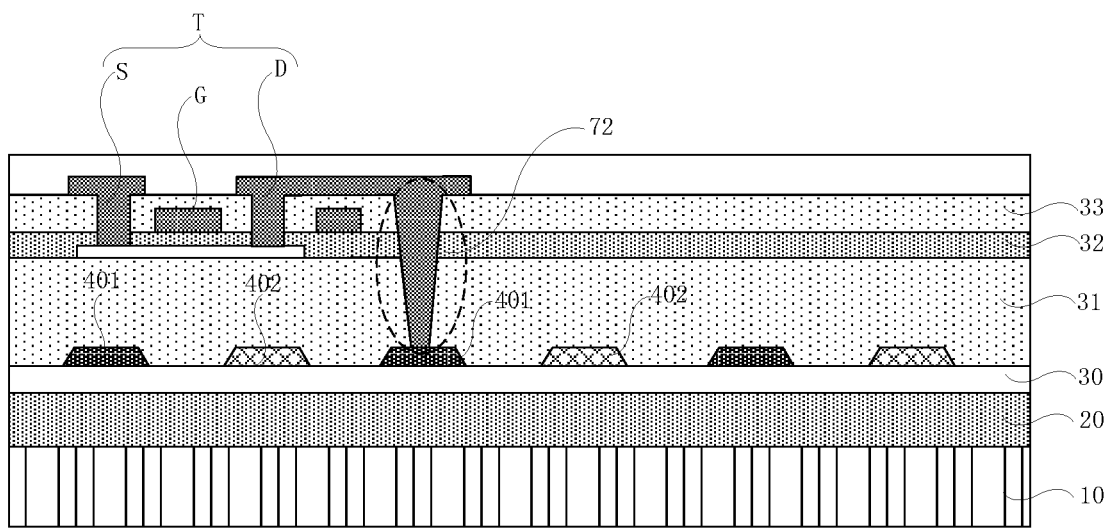
FIG. 6 is a cross-sectional structural view of a detection panel according to some embodiments of the present disclosure, in which a second insulating layer, a gate insulating layer, and a passivation layer are shown.

The above description has been made by taking the switching transistor T as a TFT of a bottom gate type as an example. Further, the above-described switching transistor T may also be a TFT of a top gate type as shown in FIG. 6. For a TFT of a top gate type, the gate insulating layer 32 is closer to the base substrate 10 than the gate G. In this case, a via hole 72 may be formed through the third insulating layer 33, the gate insulating layer 32, and the second insulating layer 31, such that the first electrode (e.g., drain D) of the switching transistor T is electrically connected to the sensing sub-electrode 401 through the via hole 72.

It should be noted that the material constituting the sensing sub-electrode 401 and the biasing sub-electrode 402 may be the same material and in the same layer as the gate G, the source S or the drain D of the switching transistor T. For example, the material constituting the above-described sensing sub-electrode 401 and the biasing sub-electrode 402 may be at least one of metallic molybdenum (Mo) or metallic aluminum (Al).

Figure 7:
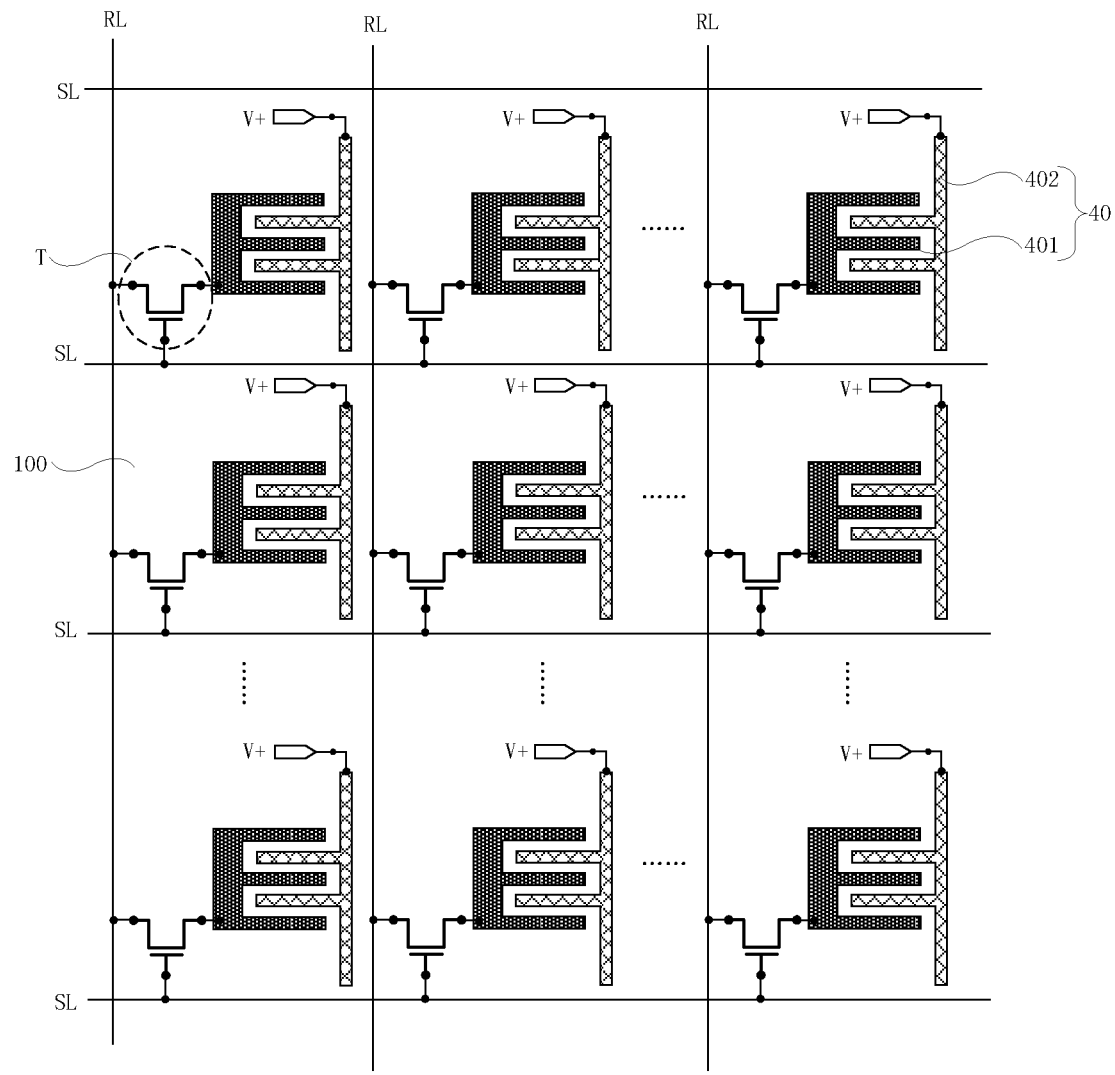
FIG. 7 is a schematic structural view of a plurality of detection units in a detection panel according to some embodiments of the present disclosure.

Based on this, in order to cause the detection panel 01 to generate an image capable of being displayed on the screen after the detection panel 01 receives the light passing through the object 03 to be detected, as shown in FIG. 7, the detection panel 01 includes a plurality of detection units 100. The information detected by all the detection units 100 is displayed behind the display screen, so as to splice together to form a detection image which is then displayed on the detection panel 01.

In this case, the detection panel 01, as shown in FIG. 7, includes a plurality of read signal lines RL and strobe signal lines SL. The read signal lines RL and the strobe signal lines SL cross each other to define the plurality of detection units 100.

It should be noted that, in some embodiments of the present disclosure, the read signal lines RL and the strobe signal lines SL may be arranged to crisscross each other, in this case, the plurality of detection units 100 defined by the plurality of read signal lines RL and the plurality of strobe signal lines SL are arranged in an array.

In addition, in order to selectively output the detection signals acquired by each of the detection units 100, one above-mentioned interdigital electrode 40 and one switching transistor T are disposed in each detection unit 100.

The gate S of the switching transistor T is electrically connected to the strobe signal line SL, and the second electrode is electrically connected to the read signal line RL.

It should be noted that the above-mentioned switching transistor T may be an N-type transistor or a P-type transistor, which is not limited in the disclosure. In addition, the first electrode of the switching transistor T may be a source S, the second electrode may be a drain D; or alternatively, the first electrode is the drain D and the second electrode is the source S. For convenience of explanation, the following embodiments are described by taking the first electrode of the switching transistor T being the drain D and the second electrode being the source S as an example.

The detection process of the detection panel 01 will be described by taking the detection panel 01 shown in FIG. 7 as an example. Firstly, the biasing sub-electrode 402 in all of the detection units 100 is supplied with a positive voltage V+ having same voltage value. Then, the strobe signal lines SL are scanned line by line. When a row of strobe signal lines SL receive the scan signal, the switching transistors T connected to the row of strobe signal lines SL are turned on, so that the photoelectric conversion layer 20 in FIG. 5 transmits the electric signal being converted from the received light to the sensing sub-electrode 401 located in the same detection unit 100 as the switching transistor T that is turned on. Next, the detection signal on the sensing sub-electrode 401 may be transmitted to the read signal line RL connected to the switching transistor T, through the switching transistor T that is turned on, thereby completing the reading of the detection signal acquired by a row of detection units 100.

Based on this, in order to enable the detection signal on the sensing sub-electrode 401 to be continuously and stably transmitted to the read signal lines RL, the detection panel 01, as shown in FIG. 5, may further have a storage electrode 60. In some embodiments of the present disclosure, the storage electrode 60 may be of the same material and in the same layer as that of the gate of the switching transistor T.

In this case, the storage electrode 60 may form a storage capacitor together with the first electrode of the switching transistor T, for example, the drain D, to store the detection signal on the sensing sub-electrode 401, and continuously transmitting it to the read signal line RL.

The reading of the detection signals of other rows of detection units 100 is the same as those described above, and will not be described herein.

As apparent from the above, the photoelectric conversion layer 20 in FIG. 5 may be a unitary layer structure covering the base substrate 10. Further, lights are incident on the photoelectric conversion layer 20 from the base substrate 10 side, and a light receiving area of the photoelectric conversion layer 20 will not be shielded by a circuit construction formed by the switching transistor T, the strobe signal lines SL and the read signal lines RL. Therefore, each of detection units 100 has a large aperture ratio.

In addition, as lights passing through the object to be detected 03 are incident to the photoelectric conversion layer 20 from the base substrate 10 side, in order to avoid a relatively larger diffusion of lights in the base substrate 10 such that a transmission angle of the lights is changed substantially and the detection accuracy is thus affected, the above-described base substrate 10 may be an optical waveguide glass substrate in some embodiments of the present disclosure. The optical waveguide glass substrate is provided with an optical waveguide pattern thereon, which may guide the light to reduce the probability of light being diffused.

Figure 8:
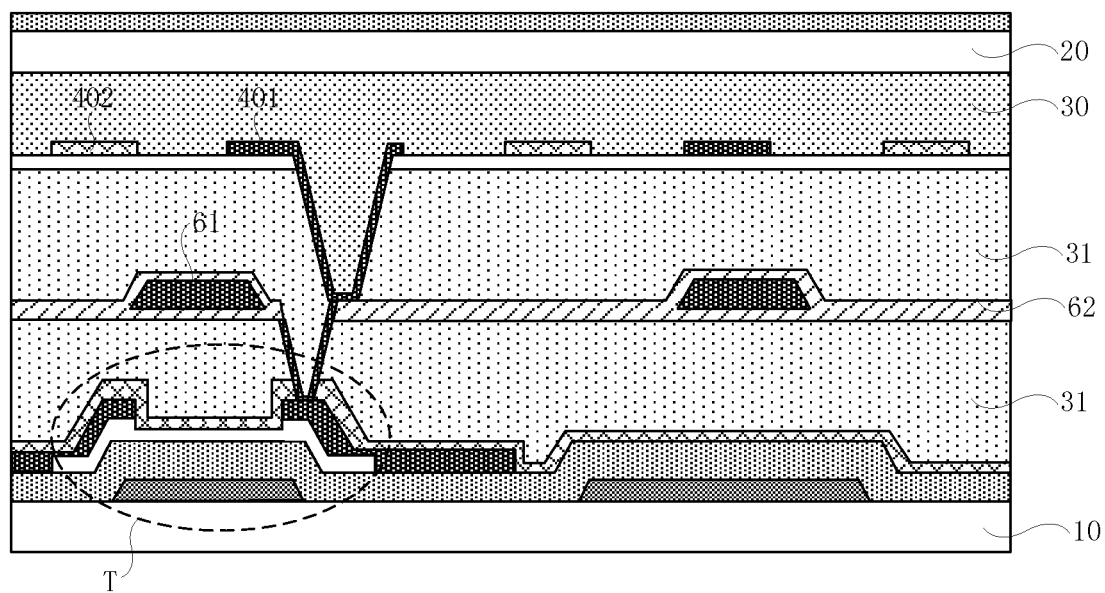
FIG. 8 is a cross-sectional structural view of a detection panel, in which two laminated second insulating layers are shown.

FIG. 8 shows a detection panel 01 in which two stacked second insulation layers are shown. In FIG. 8, the switching transistor T is disposed near the base substrate 10, and the photoelectric conversion layer 20 is disposed away from the base substrate 10. The light is incident from a side of the detection panel away from the base substrate 10, that is, from above. In order to prevent light from affecting the switching transistor T, a shielding layer 61 is needed to be disposed above the switching transistor T. In this case, in order to increase the flatness of the deposition surface for the interdigital electrode 40, it is necessary to provide two resin insulating layers, for example, two second insulating layers 31 in the structure of FIG. 8. In this case, when the two resin insulating layers are being sequentially cured at a high temperature, a phenomenon of thermal expansion and contraction occurs due to a temperature difference, so that a stress is generated inside the two resin insulating layers, causing phenomena in the resin insulating layers such as peeling or bubble forming.

Compared with the detection panel 01 shown in FIG. 8, in the detection panel 01 shown in FIG. 5 provided by the embodiment of the present disclosure, the interdigital electrode 40 (including the sensing sub-electrode 401 and the biasing sub-electrode 402) is disposed closer to the base substrate 10 than the switching transistor T. In addition, the photoelectric conversion layer 20 is located between the base substrate 10 with the first insulating layer 30 and thus the interdigital electrodes 40, so that lights are incident from the side where the base substrate 10 is located, and the shielding layer 61 as well as buffer layers 62 located above and below the shielding layer 61 are not needed at positions corresponding to the switching transistors T. In this way, only one layer of resin insulating layer, for example the second insulating layer 31 in FIG. 5, is needed between the switching transistor T and the interdigital electrode 40, so that disadvantages of peeling or bubble forming in the two second resin insulating layers 31 of the structure shown in FIG. 8 may be avoided during the production process, and the stability of the detection panel 01 is improved.

Further, in FIG. 8, the first insulating layer 30 made of polyimide covers the inductive sub-electrode 401 and the biasing sub-electrode 402. In this case, since each of the sensing sub-electrodes 401 and the biasing sub-electrodes 402 composed of a metal material is constructed in a columnar structure, there is a large gradient at corners of the sensing sub-electrodes 401 and the biasing sub-electrodes 402 after etching. Therefore, the subsequent film, for example, the above-described first insulating layer 30 has poor coverage at the above-mentioned corners, so that the insulating property of the first insulating layer 30 is decreased.

In the structure shown in FIG. 5, since the first insulating layer 30 is located below the sensing sub-electrode 401 and the biasing sub-electrode 402, the first insulating layer 30 has a good flatness which insulates the photoelectric conversion layer 20 from the sensing sub-electrode 401 and the biasing sub-electrode 402, thereby overcoming the problem that the insulation performance of the first insulating layer 30 is degraded due to poor corners of the sensing sub-electrodes 401 and the biasing sub-electrodes 402.

Further, since a side surface 41 at the edge of the interdigital electrode 40 (including the sensing sub-electrode 401 and the biasing sub-electrode 402) is inclined with respect to the surface of the first insulating layer in FIGS. 1 and 4-6, compared with the columnar structure of each of the sensing sub-electrode 401 and the biasing sub-electrode 402 of FIG. 8, the problem of a decrease in insulation property due to poor corners of the sensing sub-electrode 401 and the biasing sub-electrode 402 is also overcome.

As may be seen from the above, the detection panel 01 shown in FIG. 5 is simpler in structure and manufacturing process than the detection panel 01 of FIG. 8, thereby effectively improving production efficiency.

The embodiments of the present disclosure provide a detection device, including any one of the detection panels 01 described above. The detection panel 01 is in the form of a flat plate. Therefore, the detection device may be a flat panel detector. The above detection device has the same technical effects as the detection device provided in the foregoing embodiment, and details are not described herein again.

The above is only the specific embodiment of the present disclosure, the scope of the present disclosure is not limited thereto, and changes or substitutions of which those skilled in the art may easily think within the technical scope of the disclosure should be covered within the protective scope of the present disclosure. Therefore, the protective scope of the present disclosure should be determined by the scope of the claims.

What is claimed is:

1. A detection panel comprising a base substrate, a photoelectric conversion layer and a first insulating layer which are sequentially stacked on the base substrate;
   wherein the detection panel further comprises a plurality of interdigital electrodes located on a surface of a side of the first insulating layer away from the base substrate,
   the detection panel further comprises a second insulating layer covering the interdigital electrodes, and a plurality of switching transistors on a surface of the second insulating layer at a side thereof away from the base substrate; one of a source and a drain of each switching transistor is electrically connected to one of the interdigital electrodes,
   the interdigital electrode comprises a sensing sub-electrode in a comb shape and a biasing sub-electrode in a comb shape, the sensing sub-electrode and the biasing sub-electrode being interdigitated,
   the one of the source and the drain of the switching transistor is electrically connected to the sensing sub-electrode,
   a first via hole is provided in the second insulating layer, and the one of the source and the drain of the switching transistor is electrically connected to the sensing sub-electrode through the first via hole, and
   the switching transistor is a thin film transistor; and a second via hole is provided in the layer(s) between a gate and a source or a drain of the switching transistor, one of the source and the drain of the switching transistor is electrically connected to the sensing sub-electrode through the second via hole and the first via hole in sequence, wherein a conductive material in the first via hole is of a same material and in a same layer with the gate of the switching transistor and a conductive material in the second via hole is of a same material and in a same layer with the source or the drain of the switching transistor.

2. The detection panel according to claim 1, wherein the detection panel comprises a plurality of read signal lines and a plurality of strobe signal lines, and the read signal lines and the strobe signal lines cross each other to define a plurality of detection units;
   an interdigital electrode and a switching transistor are disposed in each one of the detection units;
   a gate of the switching transistor is electrically connected to one of the strobe signal lines, and the other of the source and the drain of the switching transistor is electrically connected to one of the read signal lines.

3. The detection panel according to claim 1, wherein the switching transistor is a bottom gate type thin film transistor; and a second via hole is provided in a gate insulating layer of the bottom gate type thin film transistor, the one of the source and the drain of the switching transistor is electrically connected to the sensing sub-electrode through the second via hole and the first via hole in sequence.

4. The detection panel according to claim 1, wherein the switching transistor is a top gate type thin film transistor; and the top gate type thin film transistor is provided with a second via hole penetrating a gate insulating layer and a passivation layer, the one of the source and the drain of the switching transistor is electrically connected to the sensing sub-electrode through the second via hole and the first via hole in sequence.

5. The detection panel according to claim 4, wherein the second via hole is aligned with the first via hole.

6. The detection panel according to claim 1, wherein the base substrate is an optical waveguide glass substrate.

7. The detection panel according to claim 1, wherein a material constituting the first insulating layer comprises polyimide.

8. The detection panel according to claim 1, wherein a material constituting the second insulating layer is a photoresist material.

9. The detection panel according to claim 1, wherein the detection panel further comprises a wavelength conversion layer configured to convert non-visible light into visible light; and
   wherein the wavelength conversion layer is located on a surface of the base substrate at a side thereof away from the first insulating layer.

10. The detection panel according to claim 1, wherein an edge of the interdigital electrodes has a side surface that is inclined with respect to the surface of the first insulating layer.

11. A detection device comprising the detection panel according to claim 1.

* * * * *